United States Patent [19]

Ingraham

[11] Patent Number: 4,758,735
[45] Date of Patent: Jul. 19, 1988

[54] DC TOUCH CONTROL SWITCH CIRCUIT

[75] Inventor: Ronald D. Ingraham, Quincy, Mich.

[73] Assignee: Nartron Corporation, Reed City, Mich.

[21] Appl. No.: 38,832

[22] Filed: Apr. 15, 1987

Related U.S. Application Data

[63] Continuation-in-part of Ser. No. 913,084, Sep. 29, 1986.

[51] Int. Cl.$^4$ .................... H01H 35/00; H05B 37/02
[52] U.S. Cl. .................... 307/116; 307/308; 307/632; 315/362; 328/5
[58] Field of Search .................... 307/116, 125, 252 B, 307/308; 315/34, 74, 208, 246, 362; 318/345, 446; 323/19, 24; 328/5

[56] References Cited

U.S. PATENT DOCUMENTS

| | | | |
|---|---|---|---|
| 3,549,909 | 12/1970 | Adelson et al. | 307/252 |
| 3,641,410 | 2/1972 | Vogelsberg | 318/345 |
| 3,651,391 | 3/1972 | Vogelsberg | 318/446 |
| 3,666,988 | 5/1972 | Bellis | 307/116 X |
| 3,899,713 | 8/1975 | Barkan et al. | 315/34 |
| 3,919,596 | 11/1975 | Bellis | 307/308 X |
| 3,965,465 | 6/1976 | Alexander | 307/125 X |
| 3,984,757 | 10/1976 | Gott et al. | 323/19 |
| 4,016,453 | 4/1977 | Moennig | 307/308 X |
| 4,031,408 | 6/1977 | Holz | 307/116 |
| 4,101,805 | 7/1978 | Stone | 315/74 |
| 4,119,864 | 10/1978 | Petrizio | 307/116 |
| 4,152,629 | 5/1979 | Raupp | 315/362 |
| 4,159,473 | 6/1979 | Senk | 307/116 X |
| 4,210,822 | 7/1980 | Wern | 307/116 |
| 4,211,959 | 7/1980 | Deavenport et al. | 315/362 |
| 4,213,061 | 7/1980 | Conner | 307/116 |
| 4,246,533 | 1/1981 | Chiang | 307/116 X |
| 4,264,831 | 4/1981 | Wern | 307/252 |
| 4,289,972 | 9/1981 | Wern | 307/116 |
| 4,289,980 | 9/1981 | McLaughlin | 307/308 |
| 4,308,443 | 12/1981 | Tucker et al. | 307/116 X |
| 4,323,829 | 4/1982 | Witney et al. | 307/116 X |
| 4,360,737 | 11/1982 | Leopold | 307/116 |

Primary Examiner—William M. Shoop, Jr.
Assistant Examiner—Sharon D. Logan
Attorney, Agent, or Firm—Price, Heneveld, Cooper, DeWitt & Litton

[57] ABSTRACT

A switching circuit includes a source of direct current for operating an oscillator which in turn applies a signal to a detector circuit including a touch plate. The detector includes a voltage dividing capacitive system or, in one embodiment, a phase detector circuit. In either embodiments, the output signal from the phase detector circuit or the voltage divider provides a control signal which can be used for actuating a solid-state switch such as a transistor or the like for providing control functions.

15 Claims, 2 Drawing Sheets

DC TOUCH CONTROL SWITCH CIRCUIT

The present application is a continuation-in-part application of pending application Ser. No. 06/913,084 filed Sept. 29, 1986 entitled "Touch Control Switch Circuit" to Ingraham. The subject matter of this prior application is incorporated herein by reference.

BACKGROUND OF THE INVENTION

The present invention relates to an electrical circuit and particularly to a touch controlled electrical switching circuit for portable direct current operation.

There exists a variety of electrical switching circuits which respond to a person's touch on a touch pad which may be in the form of a lamp base or a specific surface area of an electrical appliance to be actuated. These circuits represent a convenient manner in which a consumer can easily operate an appliance without the need for manually actuating a conventional toggle or push-button switch. U.S. Pat. Nos. 4,119,864 and 4,360,737 are representative of existing touch control switch circuits. Many of these circuits and other similar circuits require the utilization of 60 Hz line voltage for their operation. In some cases the circuits require a 60 Hz induction field which induces a voltage applied to the circuit by the human body operating as an antenna for generating a control signal.

SUMMARY OF THE PRESENT INVENTION

The system of the present invention does not rely upon the utilization of a line frequency voltage source and as such can be operated as a portable touch control switch circuit where no alternating current voltage is available. Applications for the system of the present invention include vehicles such as automobiles, trucks, boats and airplanes. The system is not necessarily limited to, however, portable applications since it can likewise be used where ac power is available.

Systems embodying the present invention include a source of direct current for operating an oscillator which in turn applies a signal to a touch plate coupled to a detector circuit. The detector includes a voltage dividing capacitive system or, in one embodiment, a phase detector circuit. In either embodiments, the output signal from the phase detector circuit or the voltage divider provides a control signal which can be used for actuating a solid-state switch such as triac or the like for providing control functions. When used in vehicles such as automobiles, the system can be used for actuating door locks, power windows, or other accessories. Thus, the touch control circuit of the present invention can be used in environments where alternating current voltage is not generally available.

These and other features, objects and advantages of the present invention can best be understood by reference to the following description thereof together with the accompanying drawings in which:

DETAILED DESCRIPTION OF THE PREFERRED EMBODIMENT

Figure 1:
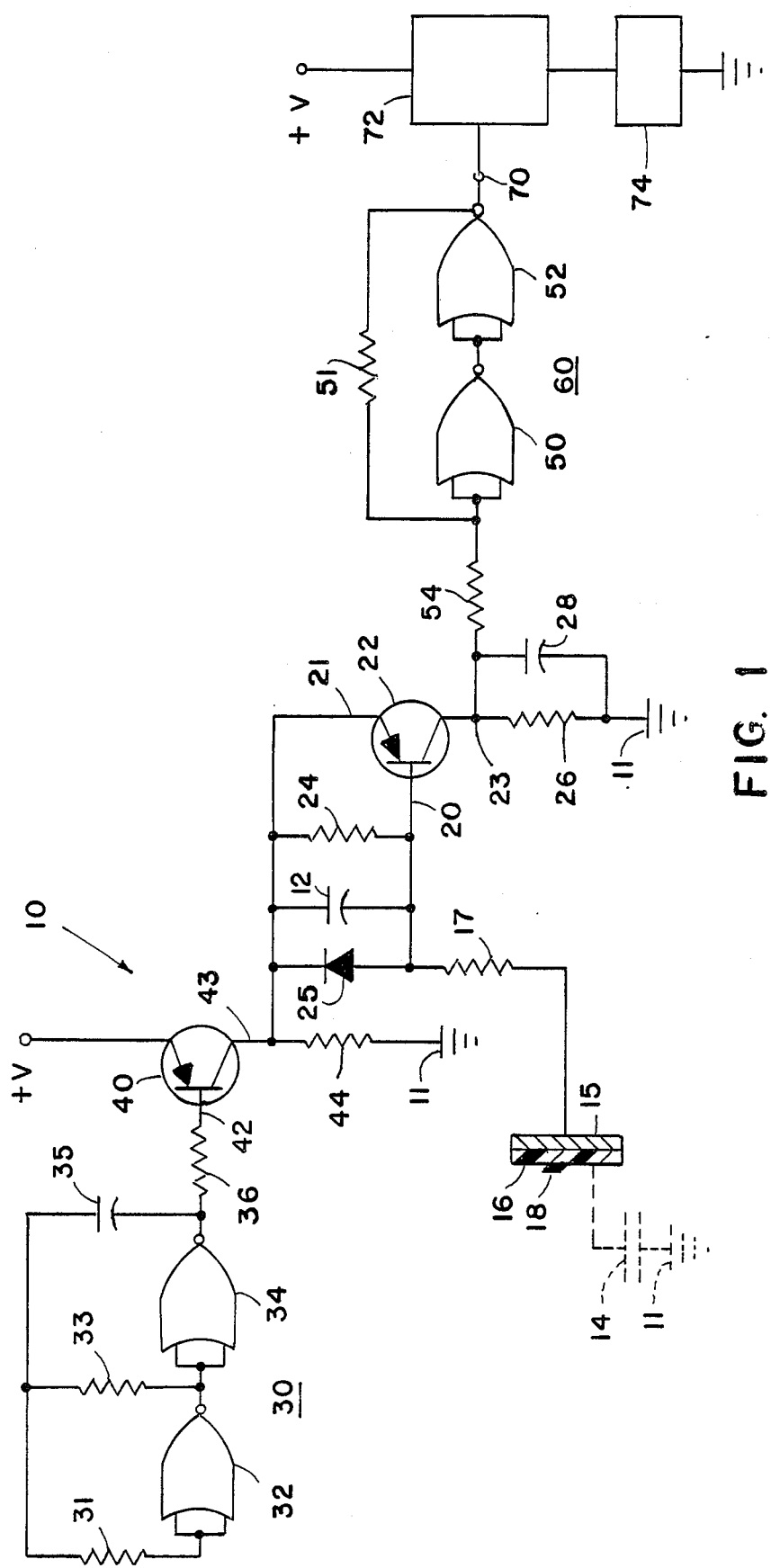
FIG. 1 is an electrical circuit diagram in block and schematic form of a first embodiment of the present invention.

Referring initially to FIG. 1 there as shown, a direct current (dc) powered touch control switch system 10 which utilizes a detector circuit including a voltage dividing capacitive circuit having a first capacitor 12 coupled in series with the body capacitance 14 of a person touching a touch plate 15. Plate 15 is electrically coupled to base terminal 20 of PNP switch transistor 22 by a current limiting resistor 17. The touch plate 15 can be made of an electrically conductive material such as aluminum or the like and may be covered by a plastic overlie 16 which can carry printed indicia 18 thereon identifying for example, the switch function. Thus, it is not necessary for the operator to actually touch the electrically conductive plate 15 but only come sufficiently close to add the body capacitance 14 in series with the voltage dividing capacitor 12 which is coupled to an oscillator circuit 30 including a drive transistor 40. Oscillator 30 is an astable multi-vibrator comprising a pair of OR gates 32 and 34 coupled as invertors and cross-coupled by resistors 31, 33 and a capacitor 35 in a conventional manner as shown in the diagram.

Resistor 36 applies the square wave output signal from the output of gate 34 to the base terminal 42 of PNP transistor 40 which has an emitter terminal coupled to the +V supply. The +V supply represents the positive terminal of a dc supply voltage such as a vehicle battery. Transistor 40 has a collector terminal 43 coupled to ground 11 which for example, is the negative terminal of the +V source (i.e. vehicle battery) by means of resistor 44. Ground 11 typically will comprise a relatively large conductive area such as the vehicle chassis coupled to the negative terminal of the vehicle battery which is necessary for operation of the system. Circuits 32 and 34 are part of an integrated circuit which is supplied operating power from the +V supply in a conventional manner. A circuit such as a commercially available model CD 4070 BE or MC 14070 BCP can be employed for circuits 32 and 34 and the remaining invertor circuits 50 and 52 coupled as a Schmitt trigger as described below.

The square wave signal applied to base terminal 42 of transistor 40 causes transistor 40 to conduct providing a positive going signal to the junction of capacitor 12 with collector terminal 43 which is coupled to the emitter terminal 21 of transistor 22. Base terminal 20 is coupled to the emitter terminal 21 by resistor 24 such that unless capacitance 14 is present by the user touching or coming proximate to touch plate 15, transistor 22 will not be forward biased and will not conduct. Thus, when plate 15 is not touched, the output signal at collector terminal 23 and across a pulse stretcher circuit comprising resistor 26 and capacitor 28 will be zero volts. When, however, a person touches plate 15 thereby coupling capacitor 14 in series with capacitor 12, the ac voltage applied to base terminal 20 will be lower than the voltage applied to the emitter 21 thereby forward biasing transistor 22 into pulsed conduction. This tends to charge capacitor 28 providing a positive dc voltage to the Schmitt trigger circuit 60. A diode 25 is coupled across the base to emitter junction of transistor 22 to provide protection against reverse breakover voltage.

The Schmitt trigger 60 comprises serially coupled inverter circuits 50 and 52 with feedback resistor 51 coupled from the output of invertor 52 to the input of invertor 50 and to capacitor 28 through resistor 54.

Thus, when plate 15 or its coating 16 is touched, the dc level across to the input of Schmitt trigger 60 will rise to a level sufficient for the Schmitt trigger circuit to trigger providing a positive going output pulse at output terminal 70 of the circuit. This control output signal can be employed as a control input for a conventional solid-state switch circuit 72 shown in block form in the figure which may include a transistor or the like coupled between the +V supply and a load 74 such as a power window motor, door lock or the like. The system can also be employed for controlling an alternating current (ac) load 74 by coupling the load and switching circuit 72 to the ac supply independently of the +V supply.

In the preferred embodiment of the invention Resistors 31 and 33 are 10 megohms and 1 megohm, respectively while capacitor 35 is 0.001 microfarad (mfd). Resistors 36 and 44 are 4.7 kilo-ohms and 1 kilo-ohm, respectively while resistor 17 was 10 megohms. Resistor 24 was 4.7 megohms while capacitor 12 was 100 picofarads. The body capacitance 14 typically ranges from 100–300 picofarads. Resistor 26 is 100 kilo-ohms while capacitor 28 is 0.01 microfarads. Resistor 54 is 100 kilo-ohms, while resistor 51 is 1 megohm.

Figure 2:
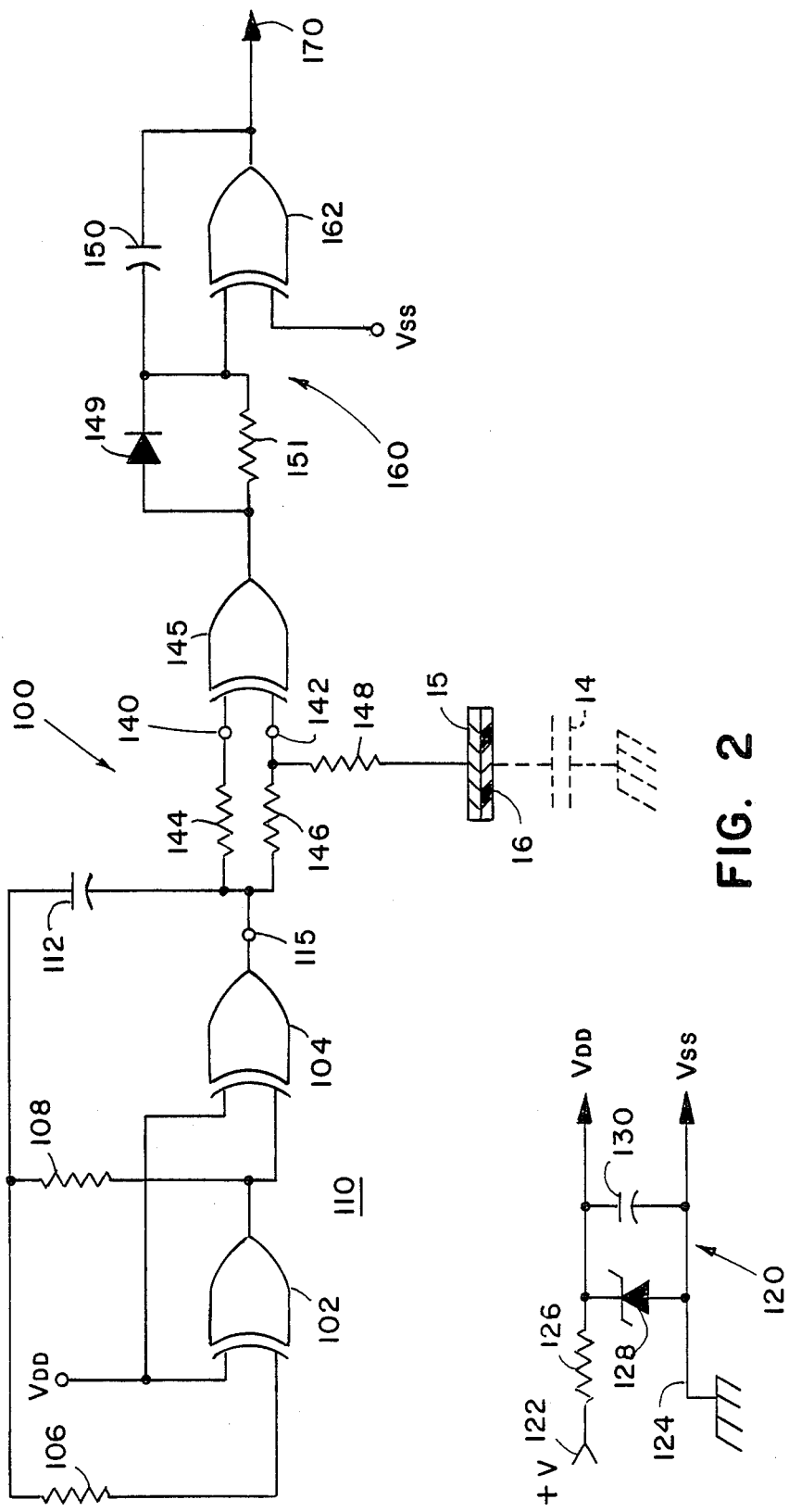
FIG. 2 is an electrical circuit diagram in block and schematic form of an alternative embodiment of the present invention.

Referring now to the FIG. 2 embodiment of the invention, circuit 100 like circuit 10 includes an oscillator circuit 110 comprising a pair of exclusive OR gates 102 and 104 each having one input terminal coupled to a dc voltage suppl $V_{DD}$. The remaining input terminals of gates 102 and 104 are coupled to each other by resistors 106 and 108 the junction of which are coupled to the output terminal 115 of gate 104 by feedback capacitor 112. Oscillator 110 provides at output terminal 115 a 1 kHz square wave signal.

A power supply 120 is coupled to the +V supply such as the battery of a vehicle at one input terminal 122 and to the chassis ground 124 of the vehicle. An input resistor 126 couples the +V source to a voltage regulating Zener diode 128 for regulating the dc voltage thereacross. The voltage is filtered by a capacitor 130 in a conventional manner to provide the $V_{DD}$ output voltage which is somewhat lower than the input voltage. The ground terminal of supply 120 comprises the $V_{SS}$ supply indicated in circuit 100.

Output terminal 115 of oscillator 110 is commonly coupled to the two input terminals 140 and 142 of a detector circuit including an exclusive OR gate 145 by series coupled resistors 144 and 146. The square wave signals applied to input terminals 140 and 142 will be substantially in exact phase when the touch plate 15 is not touched by a person and therefore body capacitance 14 not in the circuit. The exclusive OR gate in such circumstance will provide a logic "0" output for all polarities of these identical voltages applied to input terminals 140 and 142.

Upon touching the touch plate 15 or coating 16 the body capacitance 14 couples terminal 142 to ground by means of resistor 148 to cause a slight phase shift of the signal applied to input terminal 142. Thus, during at least a portion of each cycle of the input voltage, gate 145 will provide a dc output or a logic "1" output pulse which is applied to charge capacitor 150 through the forward biased diode 149. Typically, gate 145 will detect the dissimilar voltages applied during the leading edge of the square wave 1 kHz signals supplied by oscillator 110. The output signal from gate 145 thus, will be 1 kHz dc pulses when capacitance 14 is in the circuit or 0 volts when plate 15 is not touched. These output signals are applied to a pulse stretcher circuit 160 which includes an exclusive OR gate 162 having one terminal coupled to the junction of diode 149 and capacitor 150 and the remaining input terminal coupled to $V_{SS}$. A 10 megohm resistor 151 is coupled across diode 149 to permit the discharge of capacitor 150.

The pulse stretcher circuit 160 responds to the positive output pulses from gate 145 to initially trigger gate 162 through the application of voltage from diode 149. As the gate 145 output returns to a zero logic state, capacitor 150 which now is partially charged maintains the input terminal 161 of gate 162 high thereby maintaining the output at terminal 170 at a logic "1" level until such time as the pulsing signal from gate 145 discontinues when the operator releases contact with touch plate 15 and allows capacitor 150 to fully discharge.

The output signal at terminal 170 like the signal at terminal 70 of the FIG. 1 embodiment is coupled to the control input terminal of a suitable solid-state switch such as switch 72 as shown in FIG. 1 which is suitably coupled to a load 74 for providing a desired control function.

Thus, in both of the embodiments, a soft touch capacitive type switch control system is provided which can be operated from a dc voltage source without the need for an alternating current source. These circuits are particularly well adapted for use in the automotive environment or for other vehicles. It will become apparent to those skilled in the art that various modifications to the preferred embodiments of the invention as disclosed herein can be made without departing from the spirit or scope thereof as defined by the appended claims.

The embodiments of the invention in which an exclusive property or priviledge is claimed are defined as follows:

1. A direct current powered touch controlled switching circuit comprising:
    a source of direct current power;
    an oscillator coupled to said source for providing periodic output signals therefrom;
    a series voltage divider circuit coupled to said oscillator for receiving said periodic output signals therefrom, said voltage dividing circuit including at least one capacitor and an input touch terminal for coupling a person's body capacitance in series with said at least one capacitor such that the voltage at the junction of said at least one capacitor and said touch terminal will vary upon a person touching said touch terminal; and
    a control circuit coupled to the junction of said at least one capacitor and said touch terminal and responsive to a change in voltage thereat for providing a control output signal in response to the touching of said touch terminal.

2. A circuit as defined in claim 1 wherein said control circuit includes a pulse stretcher circuit coupled to the junction of said one capacitor and said touch terminal for providing output pulses having a duration longer than said periodic output signals of said oscillator.

3. A circuit as defined in claim 2 wherein said control circuit includes a Schmitt trigger circuit.

4. A direct current powered touch controlled switching circuit comprising:
    a source of direct current power;
    an oscillator coupled to said source and providing periodic output signals;

a comparator circuit including first and second input terminals each coupled to said oscillator; and an input touch terminal for coupling a person's body capacitance when touched to one of said input terminals of said comparator such that the periodic signal thereat will be varied when said touch terminal is touched wherein said comparator responds to the signal variation to provide an output control signal indicating the touching of said touch terminal.

5. A circuit as defined in claim 4 wherein said comparator comprises an exclusive OR gate.

6. A circuit as defined in claim 5 and further including a pulse stretcher circuit having an input coupled to the output of said OR gate and responsive to said output control signal for providing a predetermined logic output signal when said touch terminal is touched.

7. A circuit as defined in claim 6 and further including a switch circuit having a control input terminal coupled to the output of said pulse stretcher circuit and switch terminals coupling a load to a source of power.

8. A direct current powered touch controlled switching circuit comprising:

a source of direct current power;

an oscillator coupled to said source for providing periodic output signals therefrom; and a detector circuit coupled to said oscillator for receiving said periodic output signals therefrom, said detector circuit including an input touch terminal said detector circuit responsive to signals from said oscillator circuit and the simultaneous presence of a person's body capacitance coupled to said touch terminal when touched by a person to provide a control output signal in response to the touching of said touch terminal.

9. A circuit as defined in claim 8 wherein said detector circuit comprises a series voltage divider circuit including at least one capacitor coupled to said touch terminal for coupling a person's body capacitance in series with said at least one capacitor, and a control circuit coupled to the junction of said at least one capacitor and said touch terminal and responsive to the change in voltage at said junction when said touch terminal is touched for providing a control output signal in response to the touching of said touch terminal.

10. A circuit as defined in claim 9 wherein said control circuit includes a pulse stretcher circuit coupled to the junction of said one capacitor and said touch terminal for providing output pulses having a duration longer than said periodic output signals of said oscillator.

11. A circuit as defined in claim 10 wherein said control circuit further includes a Schmitt trigger circuit coupled to said pulse stretcher circuit and responsive to output pulses therefrom to provide a predetermined logic output signal when said touch terminal is touched.

12. A circuit as defined in claim 9 wherein said detector circuit comprises a comparator circuit including first and second input terminals each coupled to said oscillator and one of said input terminals of said comparator coupled to said touch terminal such that the body capacitance when coupled to the touch terminal will effect a change in voltage at said one input terminal resulting in the generation of said control output signal by said comparator circuit.

13. A circuit as defined in claim 12 wherein said comparator comprises an exclusive OR gate.

14. A circuit as defined in claim 13 and further including a pulse stretcher circuit having an input coupled to the output of said OR gate for providing a predetermined logic output signal in response to the receipt of a control output signal from said OR gate.

15. A circuit as defined in claim 14 and further including a switch circuit having a control input terminal coupled to the output of said pulse stretcher circuit and switch terminals coupling a load to a source of power.

* * * * *